(12) United States Patent
Zhao et al.

(10) Patent No.: US 11,837,298 B2
(45) Date of Patent: *Dec. 5, 2023

(54) ROBUSTNESS-AWARE NAND FLASH MANAGEMENT

(71) Applicant: Innogrit Technologies Co., Ltd., Shanghai (CN)

(72) Inventors: Gang Zhao, Chandler, AZ (US); Lin Chen, Cupertino, CA (US); Jie Chen, Milpitas, CA (US); Qun Zhao, Pleasanton, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/903,390

(22) Filed: Sep. 6, 2022

(65) Prior Publication Data

US 2023/0005554 A1 Jan. 5, 2023

Related U.S. Application Data

(63) Continuation of application No. 17/147,539, filed on Jan. 13, 2021, now Pat. No. 11,488,678.

(51) Int. Cl.
| | |
|---|---|
| *G11C 16/14* | (2006.01) |
| *G11C 16/34* | (2006.01) |
| *G06F 12/02* | (2006.01) |
| *G11C 16/10* | (2006.01) |
| *G11C 16/16* | (2006.01) |
| *G11C 16/26* | (2006.01) |

(52) U.S. Cl.
CPC ...... *G11C 16/3495* (2013.01); *G06F 12/0253* (2013.01); *G11C 16/10* (2013.01); *G11C 16/16* (2013.01); *G11C 16/26* (2013.01); *G11C 16/349* (2013.01)

(58) Field of Classification Search
CPC ..... G11C 16/3495; G11C 16/10; G11C 16/16; G11C 16/26; G11C 16/349; G06F 12/0253
See application file for complete search history.

(56) References Cited

U.S. PATENT DOCUMENTS

| | | | | |
|---|---|---|---|---|
| 2018/0081543 | A1* | 3/2018 | Muchherla | G06F 3/0604 |
| 2019/0324693 | A1* | 10/2019 | Ji | G06F 3/0604 |
| 2019/0339902 | A1* | 11/2019 | Yanes | G06F 3/0688 |
| 2020/0401514 | A1* | 12/2020 | Liang | G11C 11/1659 |
| 2021/0026558 | A1* | 1/2021 | Zhang | G06F 3/0679 |
| 2021/0042233 | A1* | 2/2021 | Lee | G06F 3/0659 |
| 2021/0073119 | A1* | 3/2021 | Amaki | G06F 3/0613 |
| 2021/0342263 | A1* | 11/2021 | He | G06F 12/0246 |

* cited by examiner

*Primary Examiner* — Mushfique Siddique
(74) *Attorney, Agent, or Firm* — IPro, PLLC

(57) ABSTRACT

Systems, apparatus and methods are provided for performing program operations in a non-volatile storage system. In one embodiment, there is provided a method that may comprise categorizing active storage blocks of a non-volatile storage device into a robust group and a less-robust group based on a number of factors including page error count, program time and number of Program/Erase (P/E) cycles; determining that a cache program operation needs to be performed; selecting a first storage block from the robust group to perform the cache program operation; determining that a regular program operation needs to be performed; and selecting a second storage block from the less-robust group to perform the regular program operation.

20 Claims, 2 Drawing Sheets

ROBUSTNESS-AWARE NAND FLASH MANAGEMENT

RELATED APPLICATIONS

This application is a continuation of U.S. patent application Ser. No. 17/147,539, filed Jan. 13, 2021, and entitled "ROBUSTNESS-AWARE NAND FLASH MANAGEMENT," the entire content of which is incorporated herein by reference.

TECHNICAL FIELD

The disclosure herein relates to the NAND flash device management and implementation, particularly relates to program operations for NAND flash device.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use NAND flash devices to achieve data storage. The NAND flash devices are a family of integrated circuits that are manufactured by advanced process and assembly technologies to achieve multiple levels of vertical stacking of storages units into a small footprint of die and package for high capacity of storage.

The increased storage capacity with new NAND flash process technology breakthroughs have also led to reduced reliability of the NAND storage cells. For NAND flash devices, a program operation refers to the operation that writes data into the NAND flash devices. And NAND flash devices normally contain bad blocks, which include factory bad blocks that are originally defective from the manufacture process and grown bad blocks that become defective after a number of PIE cycles. As a well-known behavior, the NAND storage cells begin to wear out with the increased number of program and erase (P/E) cycles, leading to an increased number of error counts and an increased number of grown bad blocks.

NAND flash devices typically provide two kinds of program operations: regular program operations and cache program operations. Both program operations involve receiving data into cache registers (cache buffer), and moving the data into the data registers (data buffer) and the NAND storage cell arrays. The cache program operation will acknowledge the SSD controller upon the completion of data transfer from the cache buffer into the data buffer. In contrast, the regular program operation will not acknowledge the SSD controller until completion of data transfer into the NAND storage cell array, which takes a long time of program time (e.g., tPROG) in the order of several milliseconds.

Most modern SSD controllers take advantage of the cache program operations to maximize the performance of writing to NAND flash devices. With this feature enabled, the SSD controller acknowledges the host of the Write command completion once hearing from the NAND device that the data has been moved from the cache buffer into the data buffer. This approach, however, has a potential risk of program error that the final operation to write data into the NAND storage cells may still encounter failure when the particular NAND block becomes defective without the knowledge of the SSD controller. This is particularly a challenge for NAND flash devices with an increasing number of grown bad blocks over time.

To address the aforementioned problem of potential write failure into NAND storage array with a premature acknowledgement to the host, SSD controllers with an on-board DRAM can be configured to keep a copy of data in the DRAM until it is later confirmed to be successfully written to the NAND storage array. If the NAND reports a program error, the SSD controller can then simply conduct another program operation to the NAND device with the data from the DRAM.

For a DRAM-less SSD controller, however, this poses a bigger challenge as the controller can only keep a small limited amount of data at its internal SRAM. The incoming Write commands from the host may quickly outpace the storage capability of the internal SRAM while the controller is still waiting for the slow confirmation from NAND storage device for the limited amount of data stored in the SRAM, leading to an overflow of the SRAM. As a result, the DRAM-less SSD controller may not be able to save all the temporary data to its internal SRAM during a cache program operation, which may lead a catastrophic failure that the data failed to save to NAND storage is also failed to recover from the SRAM. Existing solutions trying to improve this situation may have to limit the number of cache program operations with DRAM-less SSD controller, which results in a reduction of performance. Alternatively, existing solutions may also increase the amount of internal SRAM at the price of bigger die size and higher silicon cost.

SUMMARY

The present disclosure provides a robustness-aware non-volatile storage device management technique to actively monitor the potential occurrence of grown bad blocks so as to minimize program errors. In various embodiments, the active storage blocks may be categorized into two groups (e.g., a robust group and a less-robust group) base on a number of factors, for example, average page error counts, program time (e.g., tPROG) and P/E cycle count. Different management policies may be applied to each of the two groups to achieve optimal performance with minimal probability of cache programing into a grown bad block. In one embodiment, a robustness score may be generated for an active block from the number of factors and the active block may be categorized into the robust or less-robust group by comparing the robustness score to a robustness threshold value.

In an exemplary embodiment, there is provided a method that may comprise categorizing active storage blocks of a non-volatile storage device into a robust group and a less-robust group based on a number of factors including page error count, program time and number of Program/Erase (P/E) cycles; determining that a cache program operation needs to be performed; selecting a first storage block from the robust group to perform the cache program operation; determining that a regular program operation needs to be performed; and selecting a second storage block from the less-robust group to perform the regular program operation.

In another exemplary embodiment, there is provided a non-volatile storage system. The non-volatile storage system may comprise a non-volatile storage device and a processor. The processor may be configured to categorize active storage blocks of the non-volatile storage device into a robust group and a less-robust group based on a number of factors including page error count, program time and number of Program/Erase (P/E) cycles; determine that a cache program operation needs to be performed; select a first storage block from the robust group to perform the cache program operation; determine that a regular program operation needs to be performed; and select a second storage block from the less-robust group to perform the regular program operation.

In yet another exemplary embodiment, there is provided a non-transitory machine-readable medium. The non-transitory machine-readable medium may have computer instructions that when executed by a hardware processor, may cause the hardware processor to perform: categorizing active storage blocks of a non-volatile storage device into a robust group and a less-robust group based on a number of factors including page error count, program time and number of Program/Erase (P/E) cycles; determining that a cache program operation needs to be performed; selecting a first storage block from the robust group to perform the cache program operation; determining that a regular program operation needs to be performed; and selecting a second storage block from the less-robust group to perform the regular program operation.

DETAILED DESCRIPTION

Figure 1:
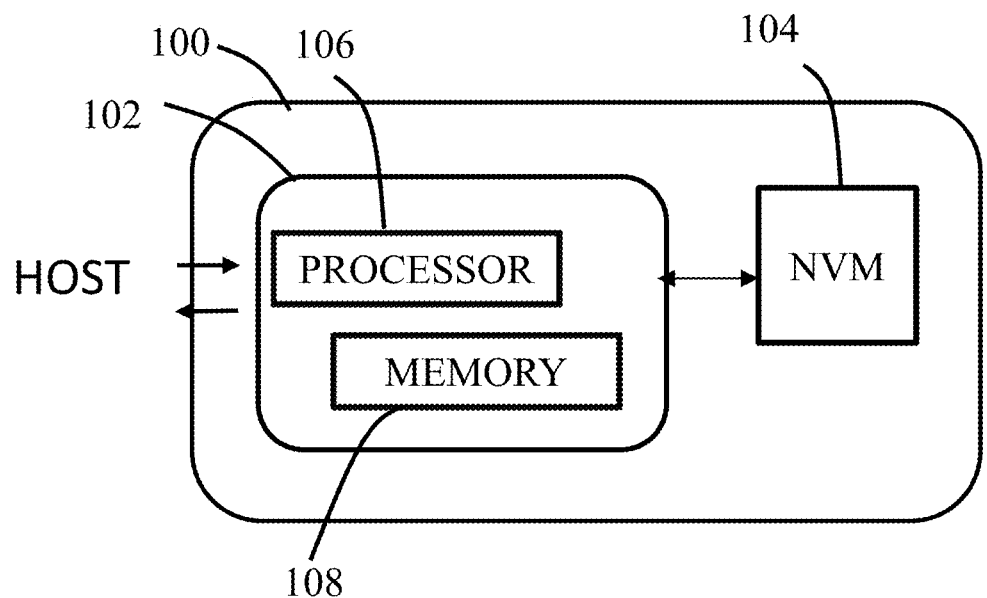
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides systems and methods for a robustness aware management of non-volatile storage devices. As used herein, a non-volatile memory device may be a computer storage device that can maintain stored information after being powered off, and the stored information may be retrieved after being power cycled (turned off and back on). Non-volatile storage devices may include NAND flash memories, NOR flash memories, magnetoresistive random Access Memory (MRAM), resistive random access memory (RRAM), phase change random access memory (PCRAM), Nano-RAM, etc. In the description, a NAND flash may be used as an example to demonstrate the controller implemented robustness aware non-volatile storage management techniques. However, various embodiments according to the present disclosure may implement the techniques with other types of non-volatile storage devices.

FIG. 1 schematically shows a non-volatile storage system 100 in accordance with an embodiment of the present disclosure. The non-volatile storage system 100 may comprise a non-volatile storage controller 102 and a non-volatile storage device 104. The non-volatile storage system 100 may provide data storage and/or access to stored data for a host when it is coupled to the host. The non-volatile storage device 104 may be a non-volatile memory (NVM) based storage device, for example, a NAND device. It should be noted that the non-volatile storage system 100 may comprise a plurality of non-volatile storage devices and the non-volatile storage device 104 may be shown as a representative for the plurality of non-volatile storage devices. The non-volatile storage controller 102 may comprise a processor 106 and a memory 108. The processor 106 may be a computer processor, such as, but not limited to, a microprocessor or a microcontroller. The memory 108 may be a non-transitory computer-readable storage media, such as, DRAM or SRAM, to store computer executable instructions to be executed by the processor 106.

In various embodiments, which storage blocks in the non-volatile storage device 104 are bad (e.g., defective either from the manufacture process or after a number of P/E cycles) and which storage blocks in the non-volatile storage device 104 are good may be recorded so that the non-volatile storage controller 102 may use the good storage blocks for data storage (e.g., performing program operations). The good storage blocks may also be referred to as non-defective storage blocks or active storage blocks (or simply active blocks). Each active storage block may be categorized in one of two groups: a robust group and a less-robust group. The non-volatile storage controller 102 may manage program operations and storage block access based on the robustness group information. In one example embodiment, the cache program operation may be assigned to active blocks of the robust group to achieve high performance with increased reliability, while the regular program operations may be assigned to active blocks of the less-robust group where a program error can still be recovered.

Moreover, the non-volatile storage controller 102 may also set its program access policies with the robustness group information. For example, host-initiated program commands may be carried out by cache program operations using active blocks from the robust group, to maximize the throughputs between the host and the non-volatile storage system 100. In contrast, back-end program operations, such as, but not limited to, those involved in garbage collection and refresh, may be carried out by regular program operations using active blocks from the less-robust group when less performance may be needed.

The non-volatile storage controller 102 may further improve the non-volatile storage device reliability by taking advantage of the robustness information of the blocks during the garbage collection. For example, at the end of a round of garbage collection, the non-volatile storage controller 102 may add an extra step of bad block scan for those blocks within the less-robust group. If a block becomes defective, it will be labeled as a bad block and removed from active use. This may make the efforts for scanning bad blocks more efficient because only active blocks of the less-robust blocks are targeted, which may be more likely to turn defective and have a higher risk of failure during a program operation.

There are a number of indicators showing how robust a block may be before it turns completely defective, for example, the number of error bits of the pages within the block, the program time (e.g., tPROG) for programing the block, the number of P/E cycles of the block. In one embodiment, the non-volatile storage controller 102 may use these indicators as factors to determine whether a block is robust or less-robust. For example, the non-volatile storage controller 102 may evaluate number of error bits (or error count) during read operations with a smaller number of error count indicating a more robust block and a large number of error count indicating a less robust block. In one embodiment, for example, a worst-case page error count of 0.5% or less of the page size may indicate the block as a robust block. The non-volatile storage controller 102 may also evaluate the program time tPROG for a block, with a tPROG much shorter or longer than the manufacturer's specified program time showing potential physical issues inside the block. It should be noted that whether a number of error count is large or small, and whether a tPROG is long or short may be determined by tests for a particular non-volatile storage device and may be adjusted during the lifetime of the non-volatile storage device. Different non-volatile storage devices, for example, different brands, different batches by the same manufacturer, based on different architecture (e.g., Single Level Cell (SLC), Multi Level Cell (MLC), Tri Level Cell (TLC)), may all have different number of error count and/or tPROG during the lifetime of the non-volatile storage devices.

In some embodiments, a Robustness Score, R may be generated based on these robustness factors and used to track the health and robustness of each active block. The higher the Robustness Score, the healthier and more robust the active block may be, and the less likely it will suddenly turn defective during the next cache program operation. In one embodiment, R may be represented by a function of a number of variables, e.g., R=R(x1, x2, x3, ... ). The factors may be represented by the variables, which may include the program time tPROG, the page error count and P/E cycle count of a block. In one embodiment, for example, the average page error count within a block may be the variable x1, the most recent program time tPROG may be the variable x2, and the P/E cycle count may be the variable x3. The respective weight for each factor and mathematical relationships (e.g., linear, polynomial, log, etc.) for each factor may be obtained by experiments for the particular non-volatile storage device to be used. In some embodiments, the higher the page error count and the P/E cycle count, the less robust the block may be, thus the lower the robustness score. Also, the farther away from the manufacturer's specified program time, the lower the robustness score may be.

Over the lifetime of the non-volatile storage device, the values of these robustness factors may change over time and the robustness score may be adjusted overtime as well. In one embodiment, the Robustness score may be updated by an interval in proportion to the increase of the P/E cycle counts. For example, the Robustness score may be updated with the increase of every 100 P/E cycles.

In some embodiments, each of the robustness factors may be evaluated and a respective threshold values may be determined for each factor. For example, a page error count of 0.5% may be used as a threshold value for the page error count, 50% of the manufacture's rated P/E cycle count may be used as a threshold value for the number of P/E cycles, 20% within the manufacturer's specified program time may be used as a threshold value for the program time. In one embodiment, the robustness score may be assigned as an integer value from 0 to 7, with 0 indicating least robust and 7 indicating most robust. When all factors for a block are well below their threshold values, the robustness score for the block may be assigned as 7 to indicate the least risk. When all factors for the block are well above their threshold values, the robustness score for the block may be assigned as 0 to indicate the highest risk. An intermediate value of 3 may be assigned when there is only one factor above its threshold value.

In some embodiments, some variables may be evaluated for their respective historical changes or rate of changes. For example, the differences or gradients in the page error count and the program times at two separate time stamps may be used to evaluate the robustness score. In one example implementation, a significant increase in the page error count tends to indicate a risky and less robust block, thus a lower robustness score may be assigned to the block. Also, a sharp increase in the tPROG time may result in a reduction of the robustness score of the block.

The robustness score may have different value ranges in different embodiments. In addition to the 0 to 7 score range, which may be a four-bit value in one implementation, in another embodiment, the robustness score may be one single binary bit assigned to each block, with 1 representing a robust block and 0 representing a less robust block. In yet another embodiment, the robustness score may be represented with other number of bits, for example, 8 bits or one byte to represent a decimal range of 0 to 255.

In some embodiments, active storage blocks may be categorized into the robust group and the less-robust group based on the robustness score R. In one embodiment, for example, a threshold value, $R_T$, may be used to determine which group an individual active block may belong to. If an active block's robustness score R is larger than or equal to the threshold value, $R \geq R_T$, the block may be assigned to the robust group. If an active block's robustness score R is less than the threshold value, $R < R_T$, the block may be assigned to the less-robust group.

In some embodiments, the robustness score threshold $R_T$ may be dynamically set and adjusted for achieving an optimal tradeoff between performance and reliability. A low threshold $R_T$ may prioritize performance over reliability by allowing more blocks in the robust group for the faster cache program operations, which may be a good option for the non-volatile storage devices in their early stage of lifetime when the least amount of grown bad blocks are expected. A high threshold $R_T$ may be preferred for non-volatile storage devices in their late stage of lifetime, which takes a more conservative approach to ensure maximum reliability with a little expected compromise of throughput and performance.

In various embodiments, the robustness score threshold $R_T$ may be determined by testing the particular non-volatile storage device(s) to be used in the non-volatile storage system 100. Different non-volatile storage devices, for example, manufactured by different manufacturers, based on different architecture (e.g., Single Level Cell (SLC), Multi Level Cell (MLC), Tri Level Cell (TLC)), may all have different robustness score thresholds and the thresholds may be adjusted during the lifetime of the non-volatile storage devices.

Figure 2:
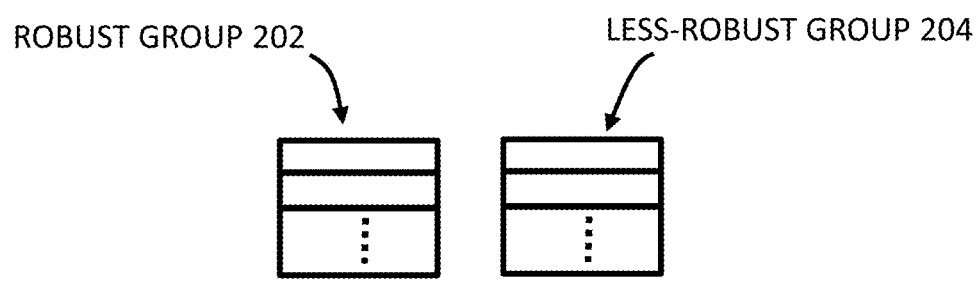
FIG. 2 schematically shows active storage blocks categorized into two groups in accordance with an embodiment of the present disclosure.

FIG. 2 schematically shows active storage blocks categorized into two groups in accordance with an embodiment of the present disclosure. The first group may be a robust group 202 that may include active blocks that the non-volatile storage controller determines to be robust. The second group may be a less-robust group 204 that may include active blocks that the non-volatile storage controller determines to be less robust. In one embodiment, these two groups may be saved in the non-volatile storage device 104 and loaded into the memory 108 during the operations of the non-volatile storage system 100.

Figure 3:
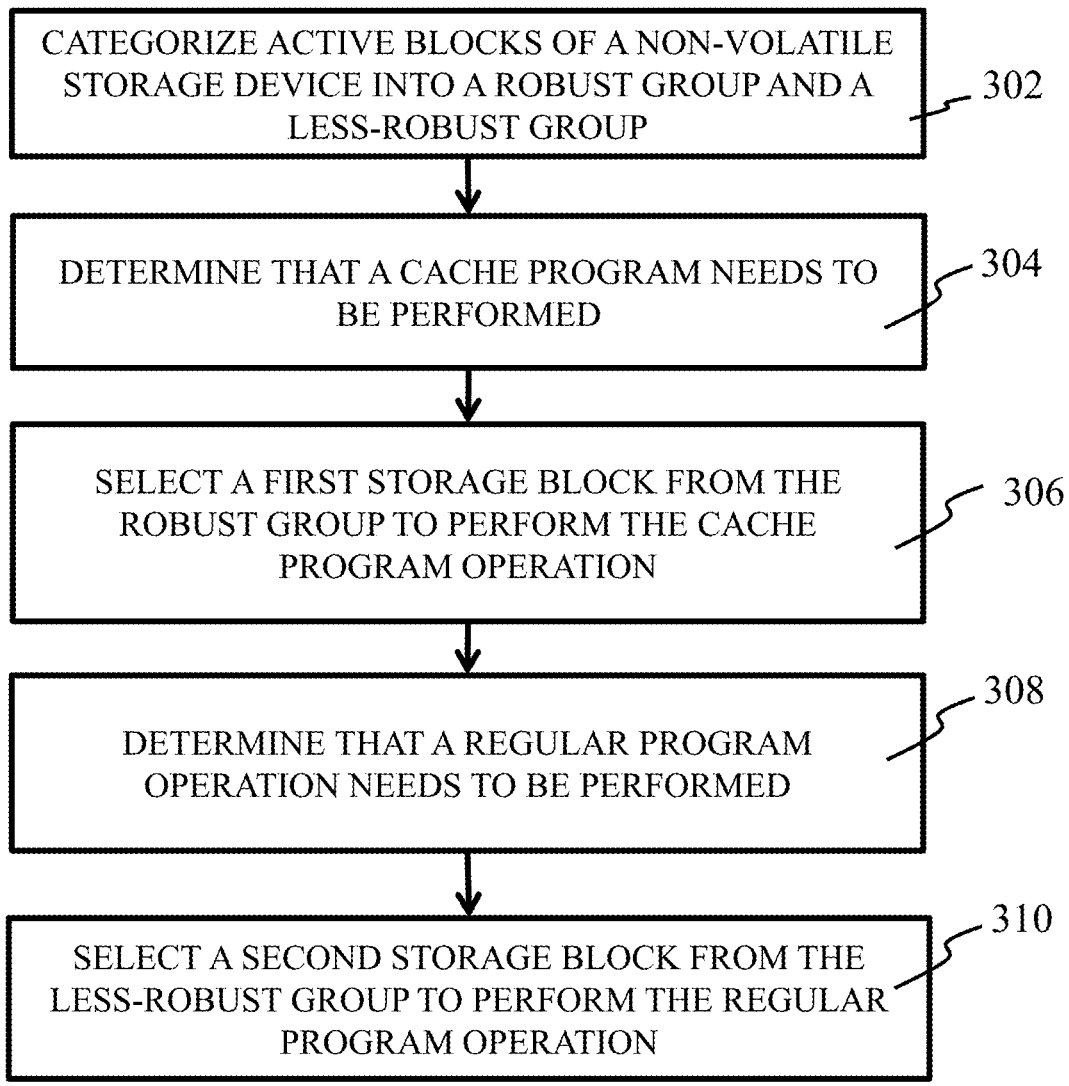
FIG. 3 is a flowchart of a process for performing program operations to a non-volatile storage device in accordance with an embodiment of the present disclosure.

FIG. 3 is a flowchart of a process 300 for performing program operations to a non-volatile storage device in accordance with an embodiment of the present disclosure.

In block 302, active storage blocks of a non-volatile storage device may be categorized into a robust group and a less-robust group based on a number of factors including page error count, program time and number of Program/Erase (P/E) cycles. In various embodiments, for example, a smaller number of error count, a shorter program time and a smaller number of P/E cycles may all indicate a block being more robust while a larger number of error count, a program time much shorter or longer than the manufacturer's specified program time and a larger number of P/E cycles may all indicate a block being less robust. In one embodiment, a robustness score for each active storage block may be generated based on the number of factors and the active storage blocks may be categorized into the robust group and the less-robust group by comparing the robustness score for each active storage block to a robustness threshold value. The robustness score may be adjusted during the lifetime of the non-volatile storage device while values of each of the factors may change over time. The robustness threshold value may further be adjusted over the lifetime of the non-volatile storage device.

In block 304, it may be determined that a cache program operation needs to be performed and in block 306, a first storage block from the robust group may be selected to perform the cache program operation. Because a robust active storage block is less likely to report an error when writing data to storage cells, embodiments may select an active storage block from the robust group to perform a cache program operation to achieve high performance with heightened reliability.

In block 308, it may be determined that a regular program operation needs to be performed and in block 310, a second storage block may be selected from the less-robust group to perform the regular program operation. Because a less-robust active storage block is more likely to report an error when storing data to storage cells, embodiments may select an active storage block from the less-robust group to perform a regular program operation so that a program error may be recovered.

The process 300 and features of the non-volatile storage system 100 related to robustness may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the process 300 and features of the non-volatile storage system 100 related to robustness may be programmed in computer processor executable instructions, stored in a non-transitory machine-readable medium (e.g., the non-volatile storage device 104, hard drive, CD, DVD, etc.) and performed by the processor 106 (e.g., a microprocessor or a microcontroller) executing the executable instructions.

In an exemplary embodiment, there is provided a method that may comprise categorizing active storage blocks of a non-volatile storage device into a robust group and a less-robust group based on a number of factors including page error count, program time and number of Program/Erase (P/E) cycles; determining that a cache program operation needs to be performed; selecting a first storage block from the robust group to perform the cache program operation; determining that a regular program operation needs to be performed; and selecting a second storage block from the less-robust group to perform the regular program operation.

In one embodiment, determining that the cache program operation needs to be performed may comprise receiving a program command from a host and determining that the program command from the host needs to be performed by the cache program operation.

In one embodiment, determining that the regular program operation needs to be performed may comprise initializing a back-end program operation and determining that the back-end program operation needs to be performed by the regular program operation.

In one embodiment, the method may further comprise generating a robustness score for each active storage block based on the number of factors. Categorizing the active storage blocks into the robust group and the less-robust group may comprise comparing the robustness score for each active storage block to a robustness threshold value.

In one embodiment, the robustness score for each active storage block may be set based on historical changes of at least some of the number of factors.

In one embodiment, the robustness threshold value may be adjusted during a lifetime of the non-volatile storage device with the robustness threshold value being low at an early stage of usage and increased with usage.

In one embodiment, the method may further comprise: initializing a garbage collection operation, determining that a block erased during the garbage collection operation belongs to the less-robust group, and performing a bad block scan on the block erased during the garbage collection operation.

In another exemplary embodiment, there is provided a non-volatile storage system. The non-volatile storage system may comprise a non-volatile storage device and a processor. The processor may be configured to categorize active storage blocks of the non-volatile storage device into a robust group and a less-robust group based on a number of factors including page error count, program time and number of Program/Erase (P/E) cycles; determine that a cache program operation needs to be performed; select a first storage block from the robust group to perform the cache program operation; determine that a regular program operation needs to be performed; and select a second storage block from the less-robust group to perform the regular program operation.

In one embodiment, to determine that the cache program operation needs to be performed may comprise to receive a program command from a host and to determine that the program command from the host needs to be performed by the cache program operation.

In one embodiment, to determine that the regular program operation needs to be performed may comprise to initialize a back-end program operation and to determine that the back-end program operation needs to be performed by the regular program operation.

In one embodiment, the processor may be further configured to: generate a robustness score for each active storage block based on the number of factors. To categorize the active storage blocks into the robust group and the less-robust group, the processor may be further configured to compare the robustness score for each active storage block to a robustness threshold value.

In one embodiment, the robustness score for each active storage block may be set based on historical changes of at least some of the number of factors.

In one embodiment, the robustness threshold value may be adjusted during a lifetime of the non-volatile storage device with the robustness threshold value being low at an early stage of usage and increased with usage.

In one embodiment, the processor may be further configured to: initialize a garbage collection operation, determine that a block erased during the garbage collection operation belongs to the less-robust group, and perform a bad block scan on the block erased during the garbage collection operation.

In yet another exemplary embodiment, there is provided a non-transitory machine-readable medium. The non-transitory machine-readable medium may have computer instructions that when executed by a hardware processor, may cause the hardware processor to perform: categorizing active storage blocks of a non-volatile storage device into a robust group and a less-robust group based on a number of factors including page error count, program time and number of Program/Erase (P/E) cycles; determining that a cache program operation needs to be performed; selecting a first storage block from the robust group to perform the cache program operation; determining that a regular program operation needs to be performed; and selecting a second storage block from the less-robust group to perform the regular program operation.

In one embodiment, determining that the cache program operation needs to be performed may comprise receiving a program command from a host and determining that the program command from the host needs to be performed by the cache program operation.

In one embodiment, determining that the regular program operation needs to be performed may comprise initializing a back-end program operation and determining that the back-end program operation needs to be performed by the regular program operation.

In one embodiment, the computer instructions, when executed by a hardware processor, may further cause the hardware processor to perform generating a robustness score for each active storage block based on the number of factors. Categorizing the active storage blocks into the robust group and the less-robust group may comprise comparing the robustness score for each active storage block to a robustness threshold value.

In one embodiment, the robustness score for each active storage block may be set based on historical changes of at least some of the number of factors.

In one embodiment, the robustness threshold value may be adjusted during a lifetime of the non-volatile storage device with the robustness threshold value being low at an early stage of usage and increased with usage.

In one embodiment, the computer instructions, when executed by a hardware processor, may further cause the hardware processor to perform: initializing a garbage collection operation; determining that a block erased during the garbage collection operation belongs to the less-robust group; and performing a bad block scan on the block erased during the garbage collection operation.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
generating a robustness score for each active storage block of a non-volatile storage device with a higher robustness score for an active storage block indicating the active storage block being healthier and more robust and less likely turning defective during a next program operation;
categorizing active storage blocks of the non-volatile storage device into a robust group and a less-robust group based on comparing robustness scores of the active storage blocks to a robustness threshold value;
determining that a cache program operation needs to be performed, in which a storage controller is acknowledged upon completion of data transfer from a cache buffer into a data buffer at the non-volatile storage device without data being written to a memory cell array; and
selecting a first storage block from the robust group to perform the cache program operation.

2. The method of claim 1, wherein the robustness score for each active storage block is generated based on a number of factors including a page error count, a program time and a number of Program/Erase (P/E) cycles.

3. The method of claim 2, wherein for each active storage block, an increase in the page error count results in a lower robustness score and an increase in the program time also results in a lower robustness score, and each active storage block's robustness score is updated by an interval in proportion to an increase of P/E cycle count for the respective active storage block.

4. The method of claim 1, further comprising adjusting the robustness threshold value during a lifetime of the non-volatile storage device with the robustness threshold value being low at an early stage of usage for more active storage blocks to be categorized in the robust group and increased with usage for less active storage blocks to be categorized in the robust group.

5. The method of claim 1, further comprising:
generating adjusted robustness scores for the active storage blocks during a lifetime of the non-volatile storage device; and
adjusting active storage blocks in the robust group and the less-robust group based on the adjusted robustness scores.

6. The method of claim 1, further comprising:
determining that a regular program operation needs to be performed, in which the storage controller is acknowledged after data having been written to the memory cell array; and
selecting a second storage block from the less-robust group to perform the regular program operation.

7. The method of claim 1, further comprising:
initializing a garbage collection operation;
determining that a block erased during the garbage collection operation belongs to the less-robust group; and
performing a bad block scan on the block erased during the garbage collection operation.

8. A non-volatile storage system, comprising:
a non-volatile storage device; and
a processor configured to:
generate a robustness score for each active storage block of the non-volatile storage device with a higher robustness score for an active storage block indicating the active storage block being healthier and more robust and less likely turning defective during a next program operation;
categorize active storage blocks of the non-volatile storage device into a robust group and a less-robust group based on comparing robustness scores of the active storage blocks to a robustness threshold value;

determine that a cache program operation needs to be performed, in which a storage controller is acknowledged upon completion of data transfer from a cache buffer into a data buffer at the non-volatile storage device without data being written to a memory cell array; and select a first storage block from the robust group to perform the cache program operation.

9. The non-volatile storage system of claim 8, wherein the robustness score for each active storage block is generated based on a number of factors including a page error count, a program time and a number of Program/Erase (P/E) cycles.

10. The non-volatile storage system of claim 9, wherein for each active storage block, an increase in the page error count results in a lower robustness score and an increase in the program time also results in a lower robustness score, and each active storage block's robustness score is updated by an interval in proportion to an increase of P/E cycle count for the respective active storage block.

11. The non-volatile storage system of claim 8, wherein the processor is further configured to adjust the robustness threshold value during a lifetime of the non-volatile storage device with the robustness threshold value being low at an early stage of usage for more active storage blocks to be categorized in the robust group and increased with usage for less active storage blocks to be categorized in the robust group.

12. The non-volatile storage system of claim 8, wherein the processor is further configured to:
generate adjusted robustness scores for the active storage blocks during a lifetime of the non-volatile storage device; and
adjust active storage blocks in the robust group and the less-robust group based on the adjusted robustness scores.

13. The non-volatile storage system of claim 8, wherein the processor is further configured to:
determine that a regular program operation needs to be performed, in which the storage controller is acknowledged after data having been written to the memory cell array; and
select a second storage block from the less-robust group to perform the regular program operation.

14. The non-volatile storage system of claim 8, wherein the processor is further configured to:
initialize a garbage collection operation;
determine that a block erased during the garbage collection operation belongs to the less-robust group; and
perform a bad block scan on the block erased during the garbage collection operation.

15. A non-transitory machine-readable medium having computer instructions, wherein the computer instructions, when executed by a hardware processor, cause the hardware processor to perform:
generating a robustness score for each active storage block of a non-volatile storage device with a higher robustness score for an active storage block indicating the active storage block being healthier and more robust and less likely turning defective during a next program operation;
categorizing active storage blocks of the non-volatile storage device into a robust group and a less-robust group based on comparing robustness scores of the active storage blocks to a robustness threshold value;
determining that a cache program operation needs to be performed, in which a storage controller is acknowledged upon completion of data transfer from a cache buffer into a data buffer at the non-volatile storage device without data being written to a memory cell array; and
selecting a first storage block from the robust group to perform the cache program operation.

16. The non-transitory machine-readable medium of claim 15, wherein the robustness score for each active storage block is generated based on a number of factors including a page error count, a program time and a number of Program/Erase (P/E) cycles, and wherein the computer instructions, when executed by a hardware processor, further cause the hardware processor to perform:
generating adjusted robustness scores for the active storage blocks during a lifetime of the non-volatile storage device; and
adjusting active storage blocks in the robust group and the less-robust group based on the adjusted robustness scores.

17. The non-transitory machine-readable medium of claim 16, wherein for each active storage block, an increase in the page error count results in a lower robustness score and an increase in the program time also results in a lower robustness score, and each active storage block's robustness score is updated by an interval in proportion to an increase of P/E cycle count for the respective active storage block.

18. The non-transitory machine-readable medium of claim 15, wherein the robustness threshold value is adjusted during a lifetime of the non-volatile storage device with the robustness threshold value being low at an early stage of usage and increased with usage for more active storage blocks to be categorized in the robust group and increased with usage for less active storage block to be categorized in the robust group.

19. The non-transitory machine-readable medium of claim 15, wherein the computer instructions, when executed by a hardware processor, further cause the hardware processor to perform:
determining that a regular program operation needs to be performed, in which the storage controller is acknowledged after data having been written to the memory cell array; and
selecting a second storage block from the less-robust group to perform the regular program operation.

20. The non-transitory machine-readable medium of claim 15, wherein the computer instructions, when executed by a hardware processor, further cause the hardware processor to perform:
initializing a garbage collection operation;
determining that a block erased during the garbage collection operation belongs to the less-robust group; and
performing a bad block scan on the block erased during the garbage collection operation.

* * * * *